(12) United States Patent
Green (10) Patent No.: US 10,653,048 B1
(45) Date of Patent: May 12, 2020

(54) FRAMES FOR SHIELDING ASSEMBLIES AND SHIELDING ASSEMBLIES INCLUDING THE SAME

(71) Applicant: Laird Technologies, Inc., Chesterfield, MO (US)

(72) Inventor: Daniel C. Green, Kunkeltown, PA (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 16/437,825

(22) Filed: Jun. 11, 2019

Related U.S. Application Data (60) Provisional application No. 62/770,604, filed on Nov. 21, 2018.

(51) Int. Cl.
| H05K 9/00 | (2006.01) |
| H05K 1/02 | (2006.01) |
| H05K 1/11 | (2006.01) |

(52) U.S. Cl.
CPC ........... *H05K 9/0032* (2013.01); *H05K 1/023* (2013.01); *H05K 1/111* (2013.01); *H05K 9/0018* (2013.01); *H05K 2201/10371* (2013.01)

(58) Field of Classification Search
CPC .......................... H05K 9/0032; H05K 9/0035
See application file for complete search history.

(56) References Cited

U.S. PATENT DOCUMENTS

| 5,495,399 | A | 2/1996 | Gore et al. |
| 7,488,902 | B2 | 2/2009 | English et al. |
| 7,501,587 | B2 * | 3/2009 | English ................ H05K 9/0032 174/354 |
| 7,504,592 | B1 | 3/2009 | Crotty, Jr. |
| 7,876,579 | B1 * | 1/2011 | Tsau ..................... H05K 9/0032 361/816 |
| 7,926,166 | B2 * | 4/2011 | Zuehlsdorf ............. H04B 1/40 174/372 |
| 2008/0062668 | A1 | 3/2008 | Kakinoki et al. |
| 2010/0157566 | A1 * | 6/2010 | Bogursky ............. H01L 23/552 361/816 |
| 2013/0033843 | A1 * | 2/2013 | Crotty, Jr. ............ H05K 9/0032 361/807 |
| 2013/0048369 | A1 * | 2/2013 | Malek ................. H05K 9/0032 174/377 |
| 2013/0148318 | A1 * | 6/2013 | Kim .................... H05K 9/0035 361/759 |
| 2016/0044835 | A1 * | 2/2016 | Lee ...................... H05K 1/0216 361/760 |
| 2018/0263144 | A1 | 9/2018 | Crotty, Jr. et al. |

FOREIGN PATENT DOCUMENTS

| JP | 2007266024 A | 10/2007 |
| JP | 2008034713 A | 2/2008 |

* cited by examiner

*Primary Examiner* — Hung V Ngo
(74) *Attorney, Agent, or Firm* — Harness, Dickey & Pierce, P.L.C.; Anthony G. Fussner (57) ABSTRACT

According to various aspects, exemplary embodiments are disclosed of frames for shielding assemblies. Exemplary embodiments are also disclosed of shielding assemblies including such frames. In exemplary embodiments, a frame for a board level shield (BLS) may include at least one finger or tab (broadly, a portion or contact) configured to fill, cover, or close off a gap or void defined by a cover's sidewalls to thereby inhibit or prevent EMI leakage through the gap or void.

17 Claims, 6 Drawing Sheets

FRAMES FOR SHIELDING ASSEMBLIES AND SHIELDING ASSEMBLIES INCLUDING THE SAME

CROSS-REFERENCE TO RELATED APPLICATION

This application claims priority to and the benefit of U.S. Provisional Application No. 62/770,604 filed Nov. 21, 2018. The entire disclosure of the above application is incorporated herein by reference.

FIELD

The present disclosure generally relates to frames for shielding assemblies and shielding assemblies including the same.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source. For example, board level shields are widely used to protect sensitive electronic devices against inter and intra system electromagnetic interferences and reduce unwanted electromagnetic radiations from a noisy integrated circuit (IC).

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

As shown in FIG. 1, the conventional stamped and folded walls of the BLS cover leaves gaps or voids that are not filled or covered by the frame such that electromagnetic interference may pass or leak through the gaps or voids.

Corresponding reference numerals indicate corresponding (although not necessarily identical) parts throughout the several views of the drawings.

DETAILED DESCRIPTION

Example embodiments will now be described more fully with reference to the accompanying drawings.

Figure 1:
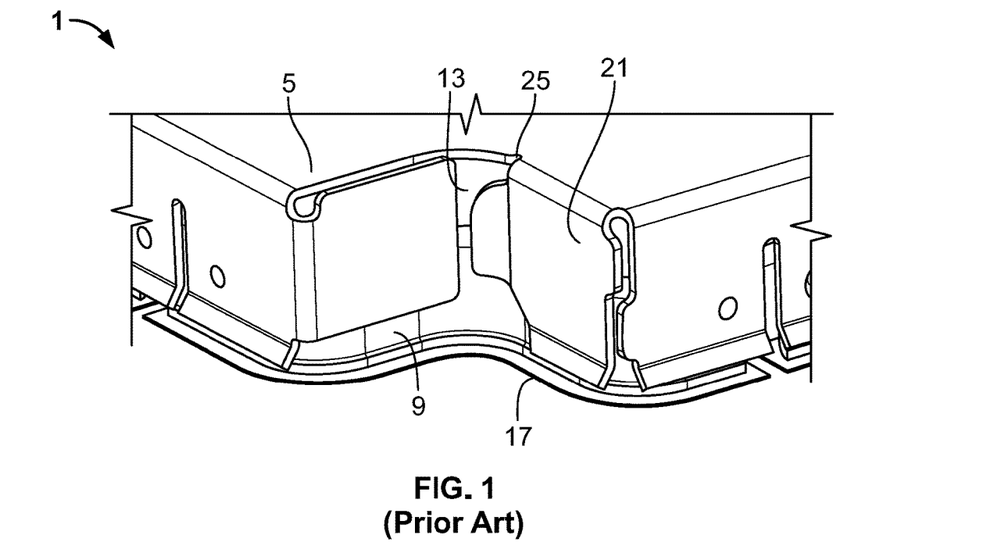
FIG. 1 is a perspective view of a conventional board level shield (BLS) that includes a frame and a cover.

By way of background, FIG. 1 illustrates a conventional board level shield 1 (BLS) that includes a cover or lid 5 and a frame or fence 9. An absorber 13 is disposed underneath the BLS cover 9. The BLS frame 5 may be soldered to the PCB solder pad 17.

As shown in FIG. 1, the BLS cover 5 includes stamped and folded sidewalls 21 defining a non-square shape (e.g., L-shape, etc.). A gap or void 25 is also defined by or generally between portions of the cover's sidewalls 21, which is not filled, covered, or closed off by the frame 9. Accordingly, electromagnetic interference (EMI) may pass or leak through the gap 25. Conventionally, a second cover (not shown) may be spot welded in order to fill, cover, or close off the gap or void 25, and thereby inhibit EMI leakage through the gap or void 25 of the cover 5.

After recognizing the above, exemplary embodiments were developed and are disclosed herein of frames for board level shields (broadly, shields or shielding assemblies). As disclosed herein, a frame may include one or more portions (e.g., fingers, tabs, contacts, etc.) configured to align with and fill, cover, or close off one or more corresponding openings, voids, gaps, etc. in a BLS cover at which the BLS cover does not provide sufficient material covering the frame and thus would otherwise allow EMI leakage. By covering the void(s) in the BLS cover, the frame's one or more portions may advantageously increase EMI shielding effectiveness of the BLS assembly including the frame and the cover.

The one or more portions of the frame may be integrally formed (e.g., stamped, cut, bent, folded, etc.) from a frame sidewall and an eave, flange, rim, or lip of the frame that extends inwardly from and/or along a perimeter defined by the frame's sidewalls. The one or more portions may comprise at least one finger, tab, or contact cut from the frame's sidewall and eave and then bent vertically such that the finger, tab, or contact extends upwardly above and beyond the frame's sidewall and eave from which it was integrally formed.

By way of example, two slots for each finger may be cut (e.g., stamped, etc.) into a piece of electrically-conductive material from which the frame will be made. The stamped material may be drawn or otherwise formed into the shape of the frame. The end of each finger may be cut or trimmed free from the slots. The finger may be folded or bent (e.g., generally perpendicularly and/or vertically, etc.) relative to the drawn eave of the frame, such that the finger extends upwardly above the frame's drawn eave. The end of the finger may be configured (e.g., bent, folded, or formed generally perpendicularly and/or horizontally, provided with a camming surface, etc.) for making better electrical contact with a portion (e.g., an inner surface, underside, etc.) of the cover and/or for a better cover lead-in.

In exemplary embodiments, the cover or lid is releasably attachable to, detachable from, and reattachable to the frame, such that the cover is reusable, e.g., after rework, etc. For example, the cover may be removed from the frame to allow for reworking and/or PCB component access while the frame remains installed to the PCB. The cover may then be releasably attached back onto the frame.

Figure 2:
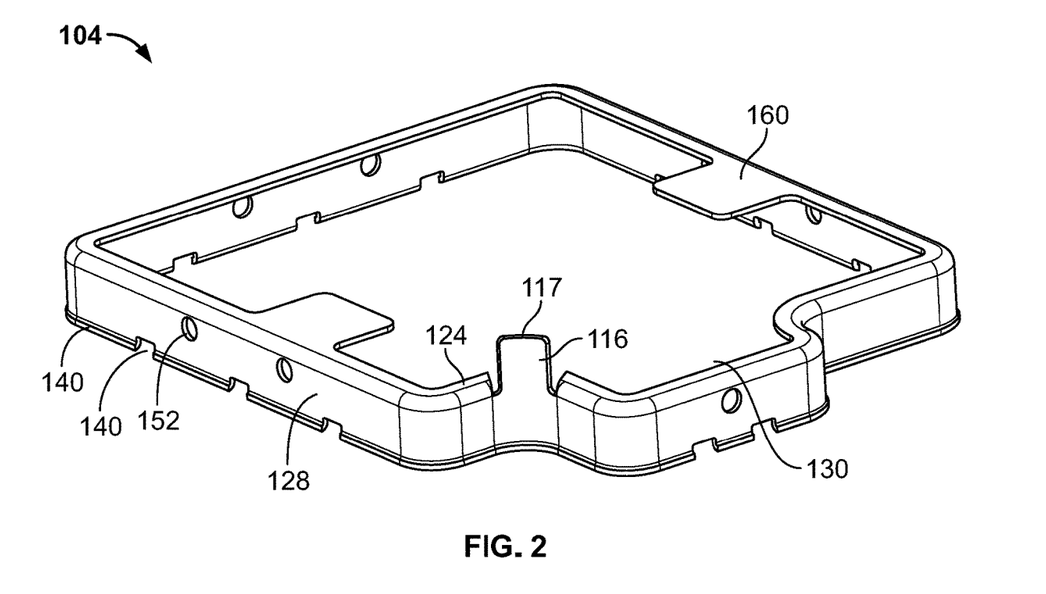
FIG. 2 is a perspective view of a frame for a board level shield (BLS) according to an exemplary embodiment in which the frame includes a finger or tab (broadly, a portion or contact) configured to fill, cover, or close off a gap or void defined by a cover's sidewalls to thereby inhibit or prevent EMI leakage through the gap or void.

FIG. 2 illustrates an exemplary embodiment of a frame 104 embodying one or more aspects of the present disclosure. FIGS. 3 through 9 illustrate an exemplary board level shield (BLS) 100 including the frame 104 and a cover 108 attachable to the frame 104.

Figure 3:
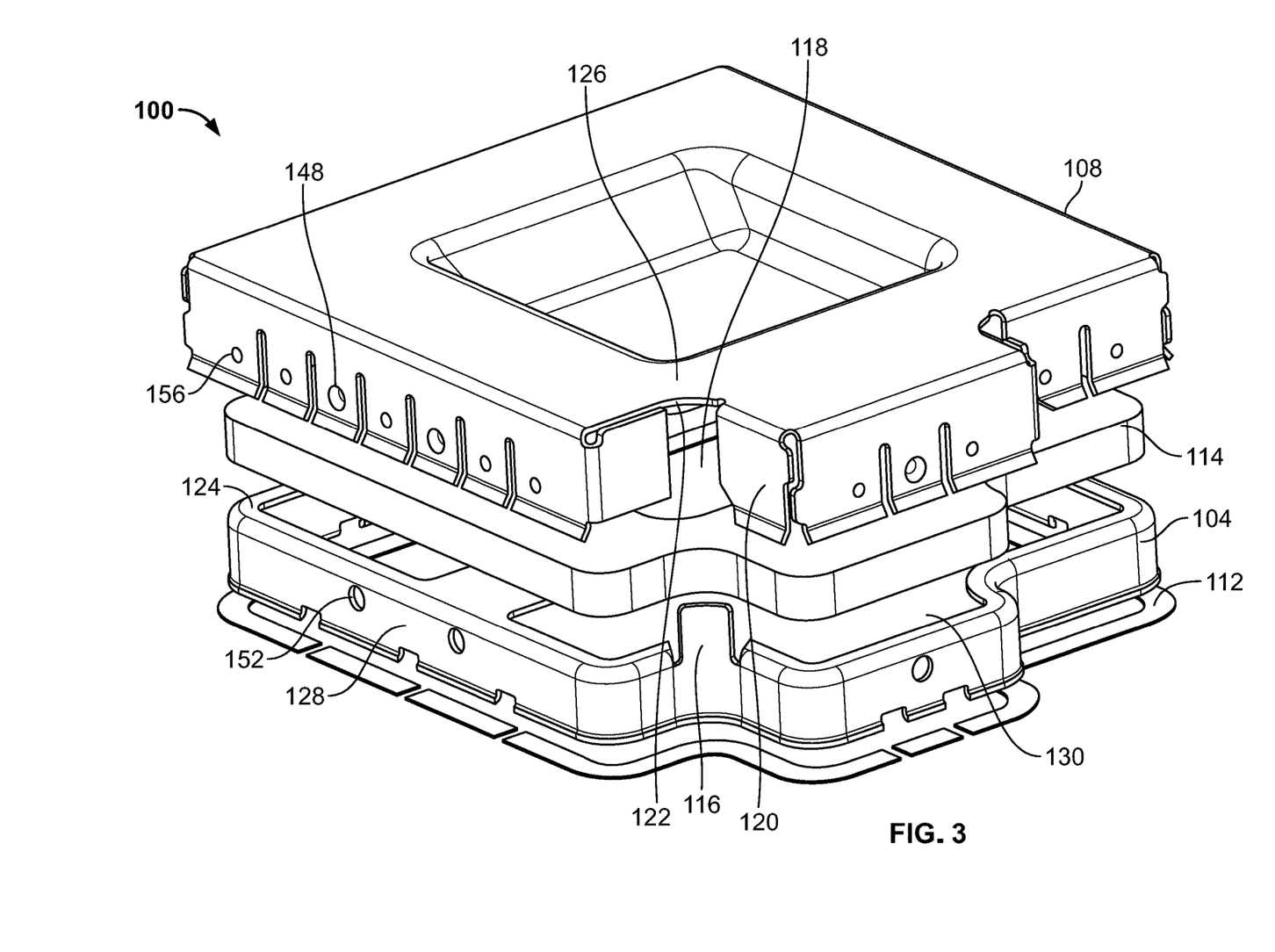
FIG. 3 is a perspective view of an exemplary embodiment of a board level shield including the frame shown in FIG. 2 and a cover attachable to the frame. Also shown in FIG. 3 are an absorber positioned between the cover and the frame and a solder pad of a printed circuit board (PCB). The frame is aligned for positioning along the PCB solder pad. And, the frame's finger or tab is aligned for positioning within or relative to the gap or void defined by the cover's sidewalls.
Figure 4:
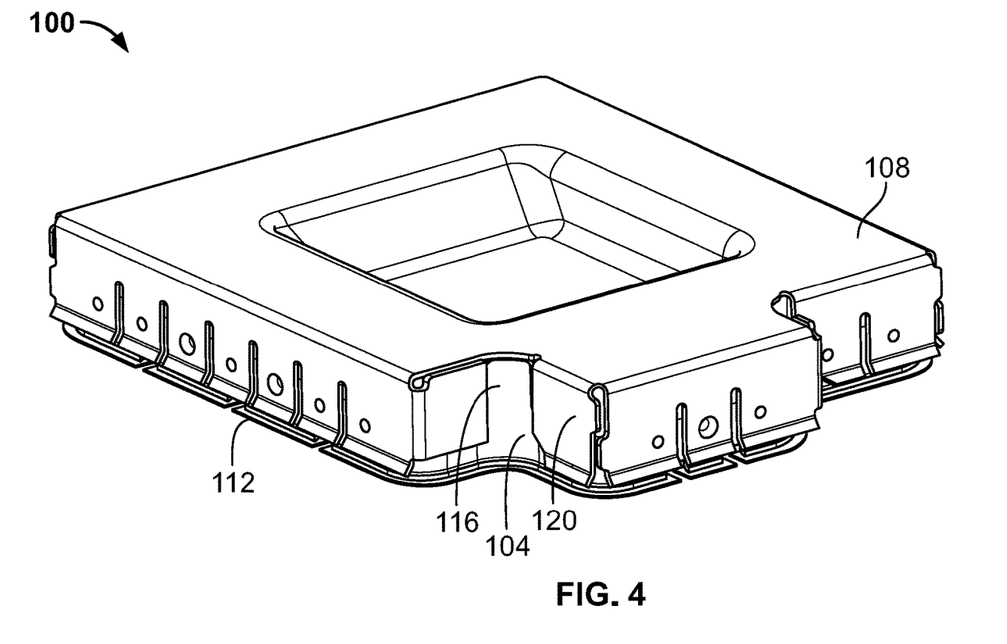
FIG. 4 is a perspective view of the board level shield shown in FIG. 3 after the cover has been attached to the frame and the frame's finger or tab is covering the gap or void defined by the cover's sidewalls.
Figure 5:
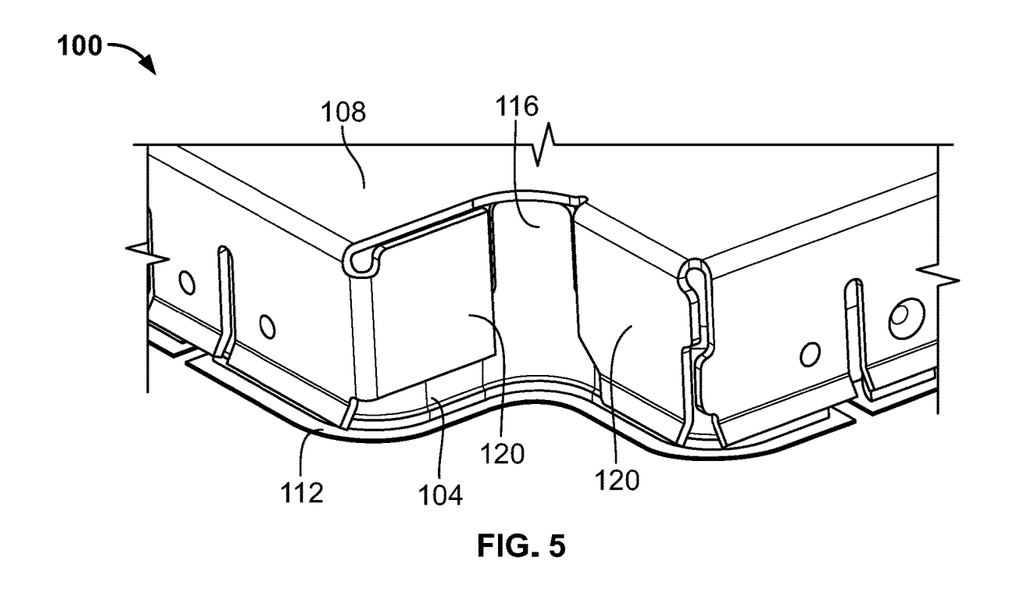
FIG. 5 is a perspective view of a portion of the board level shield shown in FIG. 4, and showing the frame's finger or tab covering the gap or void defined by the cover's sidewalls.
Figure 6:
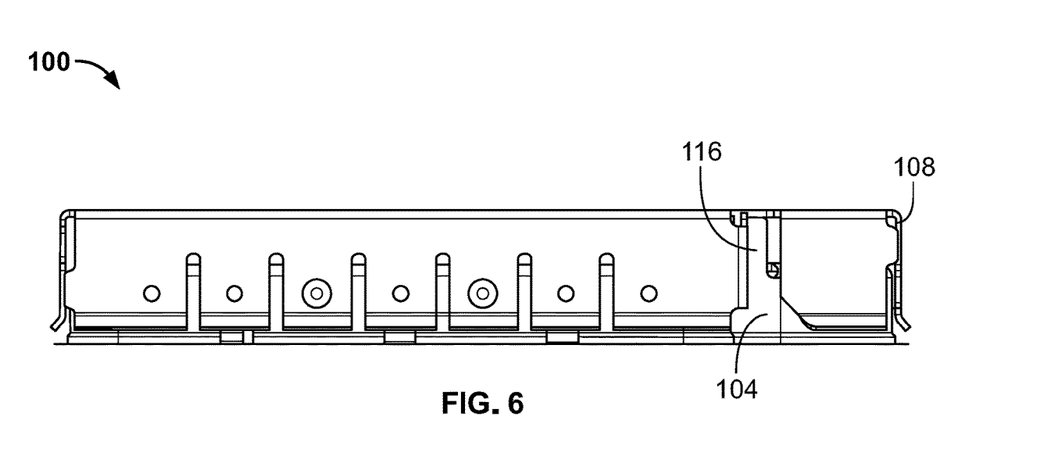
FIGS. 6 through 9 are respective side, front, top, and bottom views of the board level shield shown in FIG. 4.
Figure 7:
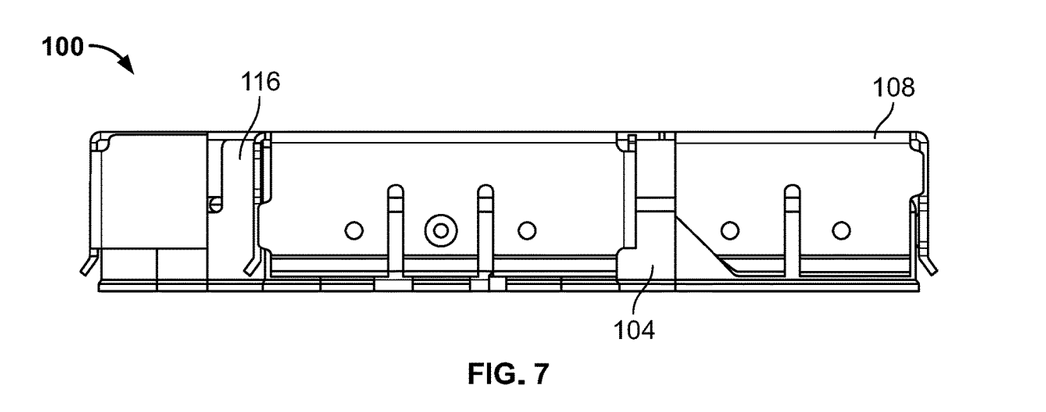
Figure 8:
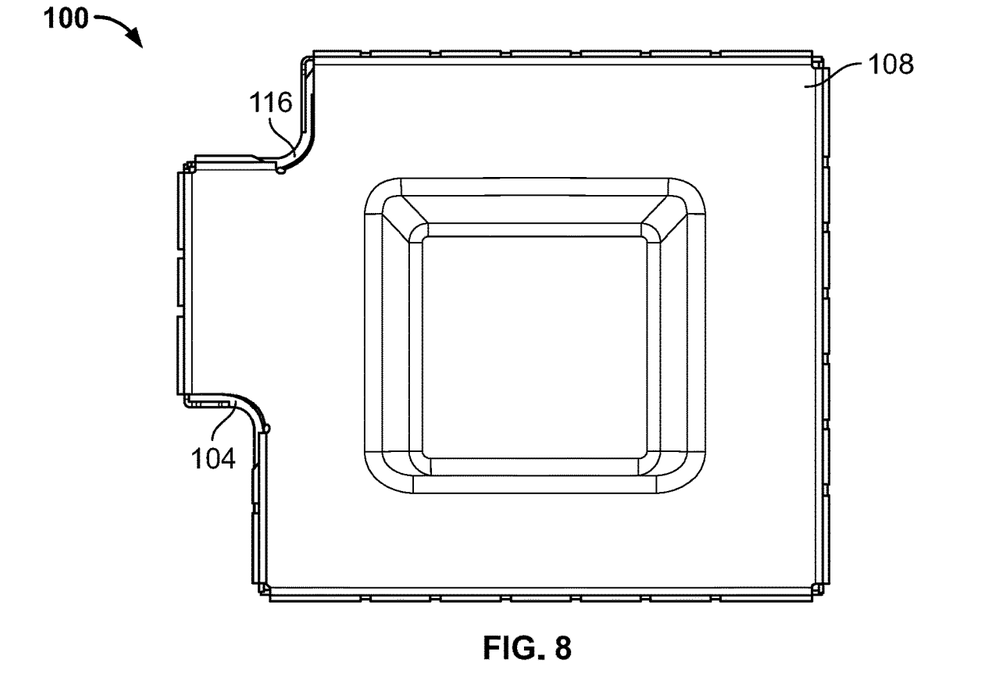
Figure 9:
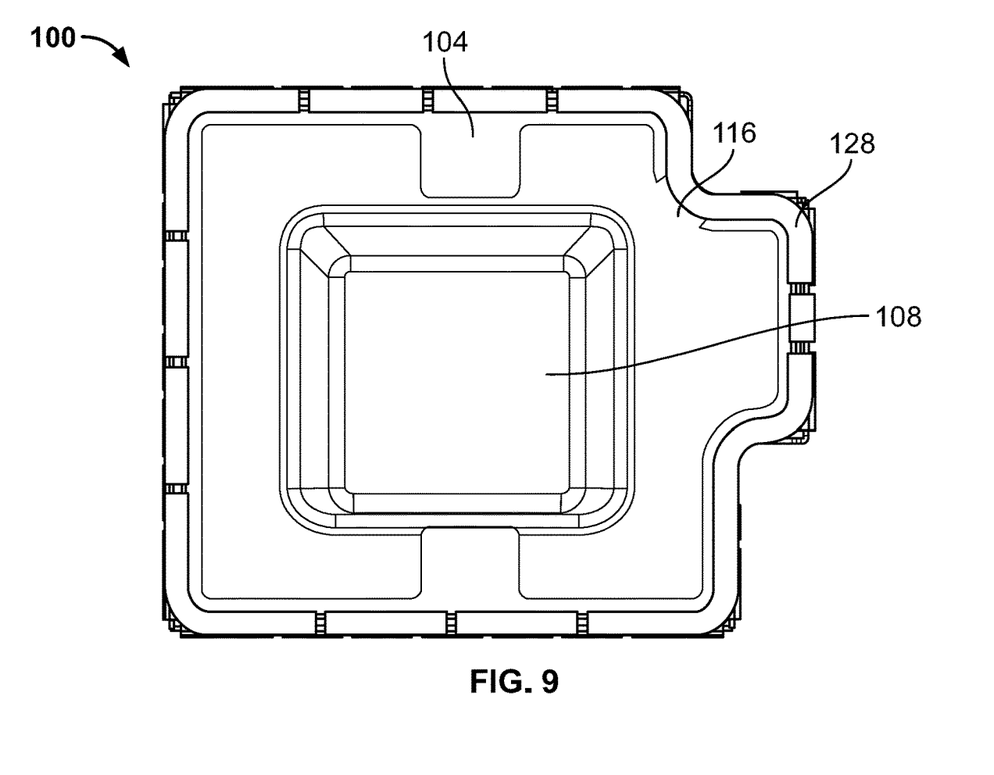

As shown in FIGS. 2 and 3, the frame 104 includes a finger or tab 116 (broadly, a contact or portion) that extends upwardly relative to the frame 104. The finger or tab 116 is configured to fill, cover, or close off a gap or void 118 (FIG. 3) defined generally between portions (e.g., tabs, etc.) of the cover's sidewalls 120. When the cover 108 is attached to the frame 104, the frame's finger 116 fills, covers, or closes off the gap or void 118 as shown in FIGS. 4 and 5. Accordingly, the frame's finger or tab 116 may thereby inhibit (e.g., prevent, reduce, etc.) EMI leakage through the gap or void 118 of the cover 108.

The finger or tab 116 may also be configured for electrically contacting a portion (e.g., inner surface, underside, etc.) of the cover 108. For example, the frame's finger or tab 116 may be sufficiently long such the free end portion or tip 117 of the finger 116 electrically contacts the underside or inner surface 122 defined by the top 126 of the cover 108. Additionally, or alternatively, the frame's finger or tab 116 may be configured (e.g., sized, shaped, located, etc.) to electrically contact the cover's sidewall portions 120 that define the gap or void 118 being covered by the frame's finger or tab 116.

The free end portion or tip 117 of the frame's finger or tab 116 may be configured (e.g., bent, folded, formed, shaped, etc.) for making better electrical contact with the cover 108. Or, for example, the free end portion or tip 117 of the finger or tab 116 may include a dimple or other feature defining a camming surface for a better cover lead-in.

With continued reference to FIG. 2, the frame 104 includes an eave, flange, rim, or lip 124 that extends inwardly from and/or along a perimeter defined by the frame's sidewalls 128. The eave 124 may define an open top or opening 130 of the frame 104. In this illustrated embodiment, the frame's finger or tab 116 may be integrally formed from the eave 124 of the frame 104. The finger or tab 116 may be vertically upright and/or generally parallel with the frame's sidewalls 128. The finger or tab 116 may be generally perpendicular to the top surface of the frame's inwardly extending eave, flange, rim, or lip 124.

The frame 104 may be configured for installation to a substrate (e.g., printed circuit board (PCB), etc.) generally about one or more components on the substrate such that the one or more components are under the board level shield 100 and/or within an interior or shielding enclosure cooperatively defined by the frame 104 and cover 108. When the board level shield 100 is installed (e.g., soldered, etc.) on the substrate, the board level shield 100 is operable for shielding the one or more components that are within the interior or shielding enclosure cooperatively defined by the frame 104 and the cover 108.

In this exemplary embodiment, the frame 104 may be made of a solderable material (e.g., 1/2 hard 770 Nickel Silver, other solderable material, etc.) such that the frame 104 is solderable to the PCB solder pads 112. The frame 104 includes mounting feet 140 (FIG. 2) along the lower edge portion of the frame 104. The mounting feet 140 may be formed with castellations (e.g., formations with alternating notches and projections, etc.). The mounting feet 140 provide areas for soldering the frame 104 to the PCB solder pads 112. The notches or openings 144 between adjacent pairs of the mounting feet 140 allow solder to flow around the mounting feet 140 for securing the frame 104 to the PCB solder pads 112. In other embodiments, the mounting feet 140 may fit in corresponding openings in a substrate for securing the frame 104 to a substrate. In still further embodiments, a frame may not include any spaced-apart mounting feet along its lower edge portions. Instead, the frame may include sidewalls each having a generally continuous lower edge portion. In addition, alternative means besides soldering may also be employed for securing a shield to a substrate, such as adhesives, mechanical fasteners, etc.

In this exemplary embodiment, the cover 108 is configured to be releasably attachable to, detachable from, and reattachable to the frame 104, such that the cover 108 is reusable, e.g., after rework, etc. For example, after the frame 104 is soldered to the solder pad 112 along a PCB, the cover 108 may be releasably attached to the frame 104. If reworking and/or other PCB component access becomes necessary, the cover 108 may be detached and removed from the frame 104 to allow reworking and PCB component access through the open top 130 of the frame 104. After the reworking and/or PCB component access is completed, the same cover 108 may then be reused and reattached to the frame 104.

The cover 108 may be releasably attachable to the frame 104 via dimples 148 and openings 152 configured to engagingly receive the dimples 148. In this exemplary embodiment, the cover's sidewalls 120 include inwardly extending dimples or protrusions 148 (broadly, retention or engagement members). The frame's sidewalls 128 include holes 152 (broadly, openings) configured for engagingly receiving the dimples 132 of the cover 108, to thereby releasably attach the cover 108 to the frame 104. The cover 108 further includes dimples 156 that contact surfaces of the frame's sidewalls 128, thereby providing additional electrical contact and a more secure mechanical attachment of the cover 108 to the frame 104. Alternative embodiments may include other suitable means or attachment mechanisms for releasably attaching the cover to the frame instead of or in addition to dimples and holes.

The cover 108 may be manually removable such as by using a tool (e.g., a plastic shim, etc.), etc. Additionally, or alternatively, the cover 108 may be configured to be removable via an at least partially automated process (e.g., without manual intervention, etc.), such as by using suitable pick and place equipment (e.g., a gripper, a pneumatic head, a vacuum pick-and-place head, a suction cup pick-and-place head, etc.).

The lower surfaces of the cover's dimples 148, 156 may include or be operable as camming surfaces. As the cover 108 is slidably moved downward relatively onto the frame 104, the camming surfaces may contact the eave 124 of the frame 104. This contact causes outward flexing or inward movement of the cover's sidewall portions or tabs 120, which may have slots, gaps, or openings therebetween for increased flexibility. The outward movement of the cover's sidewall portions 120 allows the cover's dimples 148 to slide along the frame's sidewall portions 128 until the dimples 148 are aligned with the holes 152 in the frame's sidewall portions 128. The cover's sidewall portions 120 may then resiliently move, flex, or snap back inwardly to thereby frictionally engage the cover's dimples 148 within the frame's holes 152.

The BLS 100 may be compatible with surface mount technology (SMT). For example, the frame 104 may include one or more pickup members 160 (and/or electrical contacts) that allows the frame 104 to be picked up and placed on the PCB solder pads 112 via suitable pick and place equipment (e.g., a gripper, a pneumatic head, a vacuum pick-and-place head, a suction cup pick-and-place head, etc.).

The frame's pickup members 160 may extend inwardly from the eave 124 of the frame 104. The frame's pickup members 160 may be configured to define a platform or other support surface for the absorber 114 (FIG. 3). The frame's pickup members 160 may be configured (e.g., shaped, sized, located, etc.) to support the absorber 114 and/or electrically contact an inner surface or underside of the cover 108 when the cover 108 is releasably attached to the frame 104. The cover's underside may contact the absorber 114, which, in turn, may compress the absorber 114 and/or cause the frame's pickup members 160 to flex or compress downwardly. The frame's pickup members 160 may be resiliently flexible such that the resilient nature of the frame's pickup members 160 biases the pickup members 160 to return to their original position. This, in turn, may help ensure that the pickup members 160 maintains good contact with the absorber 114 and/or underside of the cover 108 and/or also help maintain a good continuous locking attachment between the cover 108 and the frame 104. For example, the downwardly flexed or compressed frame pickup members 160 may apply upward pressure against the absorber 114 and/or underside of the cover 108, which may help to inhibit rattling or vibration of the cover 108 and/or may help provide generally continuous locking of the cover 108 to the frame 104 even though the cover 108 includes sidewall portions 120 (e.g., individual fingers, etc.) having gaps therebetween.

The frame 104 may be formed from a single piece of electrically-conductive material (e.g., single blank of material, etc.) such that the frame 104 (e.g., finger or tab 116, sidewalls 120, eave 124, pick up members 160, etc.) has an integral, monolithic, single-piece construction. For example, a flat profile pattern for the frame 104 and portions thereof (e.g., finger or tab 116, sidewalls 120, eave 124, pick up members 160, etc.) may be stamped into a piece of material. The frame's sidewalls 128 may be formed, bent, drawn, shaped, folded, etc. The frame's finger or tab 116 may be formed, bent, wiped, etc. Even though the frame 104 may be integrally formed (e.g., stamping and bending/folding/drawing, etc.) from the same piece of material substantially simultaneously in this example, such is not required for all embodiments.

The cover 108 may be formed from a single piece of electrically-conductive material (e.g., single blank of material, etc.) such that the cover 108 has an integral, monolithic, single-piece construction. For example, a flat profile pattern for the cover 108 and portions thereof (e.g., sidewalls 120, dimples 148, 156, etc.) may be stamped into a piece of material. The cover's sidewalls 120 may then be formed, bent, drawn, shaped, folded, etc. Even though the cover 108 may be integrally formed (e.g., stamping and bending/folding/drawing, etc.) from the same piece of material substantially simultaneously in this example, such is not required for all embodiments.

The absorber 114 shown in FIG. 3 may comprise an EMI absorber or microwave absorber from Laird, such as an Eccosorb material (e.g., GDS/SS6M, BSR-SS6M, JCS9/SS6M, etc.), etc. The absorber 114 may include a pressure-sensitive adhesive (PSA) tape for adhesively attaching the absorber 114 along the inside of the cover 108.

The absorber 114 may comprise Eccosorb® GDS High-Loss, Thin, Elastomeric Microwave Absorber, which is a relatively thin, flexible, high-loss, magnetically loaded, electrically non-conductive silicone rubber sheet. The absorber 114 may be designed for the frequency range from 6 GHz and above. The absorber 114 may be impervious to moisture and can be subjected to high altitudes with no or without significant adverse effects. The absorber 114 may be a silicone based absorber that has low outgassing properties for space applications. Alternative embodiments, however, may include different materials for the absorber 114. Still yet other embodiments may include board level shields without any absorber 114.

Figure 10:
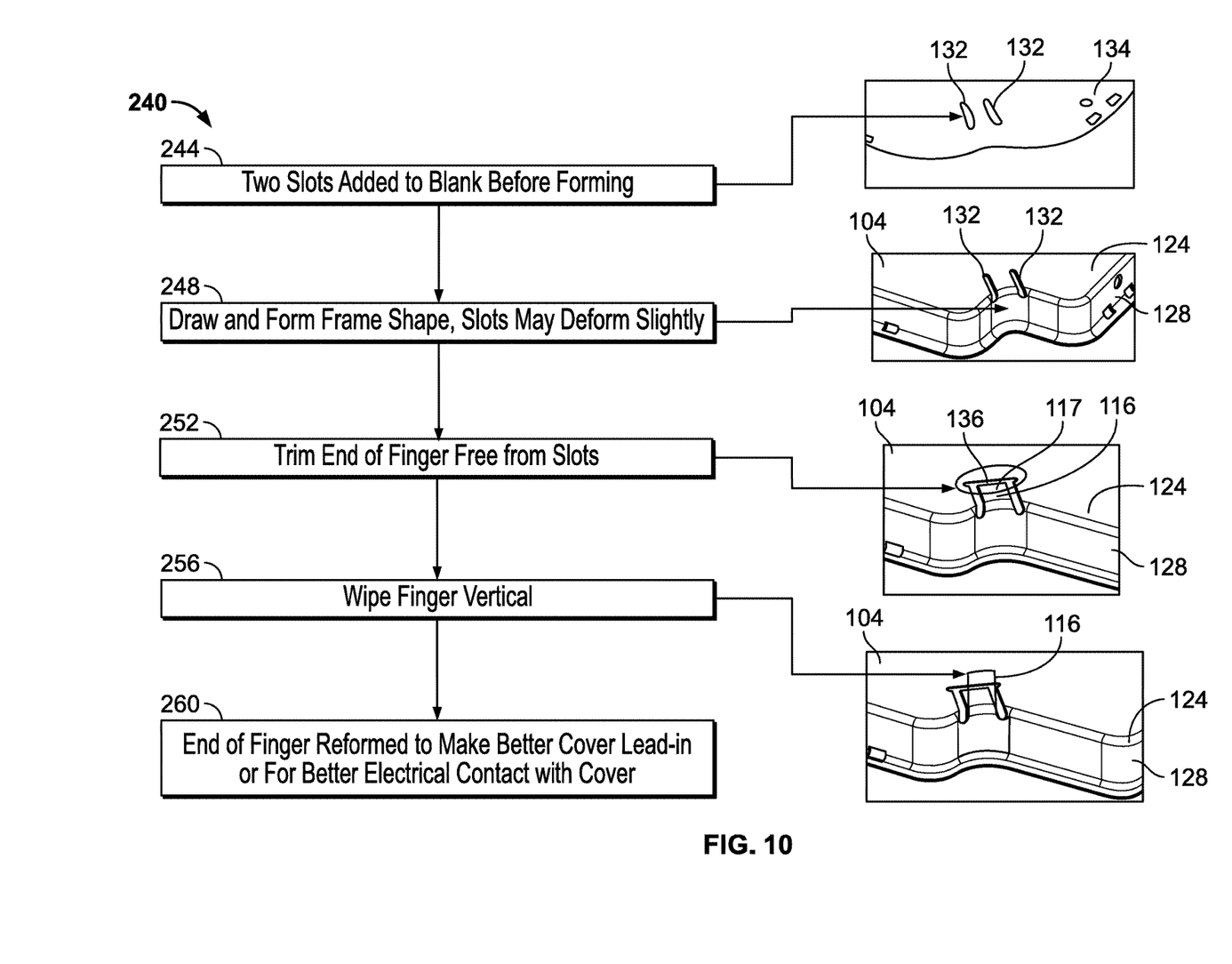
FIG. 10 illustrates an exemplary method of making a frame with a finger or tab (broadly, a portion or contact) configured to fill, cover, or close off a gap or void in a cover's sidewalls and/or to electrically contact a portion (e.g., inner surface, underside, etc.) of the cover according to an exemplary embodiment.

FIG. 10 illustrates an exemplary method 240 of making the frame 104 with the finger or tab 116 (broadly, a portion or contact) configured to fill, cover, or close off the gap or void 118 in the cover's sidewalls 120 and/or for electrically contacting a portion (e.g., inner surface, underside, etc.) of the cover 108 according to an exemplary embodiment. At step, operation, or process 244, two slots 132 for the finger or tab 116 are cut or stamped into a piece or blank of electrically-conductive material 134 from which the frame 104 will be made.

At step, operation, or process 248, the stamped material 134 is drawn or otherwise formed into the shape of the frame 104. At step, operation, or process 252, the opening 136 is formed such that the end portion 117 of the finger or tab 116 is cut or trimmed free from the slots 132. The opening 136 extends between the slots 132 such that the end portion 117 of the finger or tab 116 is cooperatively defined by the opening 136 and the slots 132.

At step, operation, or process 256, the finger or tab 116 is moved (e.g., wiped, folded, bent, etc.) relative to the slots 132 and the drawn eave 124 of the frame 104. The finger or tab 116 may be vertically upright and/or generally parallel with the frame's sidewalls 128. The finger or tab 116 may be generally perpendicular to and extend upwardly above a top surface of the drawn eave 124 of the frame 104.

At step, operation, or process 260, the end portion 117 of the finger or tab 116 may be configured, reformed, reshaped, etc. for making better electrical contact with a portion (e.g., an inner surface, underside, etc.) of the cover 108 and/or for a better cover lead-in. For example, the end portion 117 of the finger or tab 116 may be bent or folded (e.g., generally perpendicularly and/or horizontally, etc.) in order to make better electrical contact with the underside or inner surface of cover 108. Or, for example, the end of the finger or tab 116 may be provided with a dimple or other feature defining a camming surface for a better cover lead-in.

A wide range of electrically-conductive materials may be used to form a frame disclosed herein (e.g., frame 104, etc.). For example, a frame may be made of a solderable material (e.g., 1/2 hard 770 Nickel Silver, etc.), nickel plated aluminum alloy, tin plated aluminum alloy, cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

A wide range of electrically-conductive materials may be used to form a cover disclosed herein (e.g., cover 108, etc.) such as nickel plated aluminum alloy, tin plated aluminum alloy, cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

In exemplary embodiments, a thermal interface material may be applied to and/or used along with a board level shield disclosed herein. Example thermal interface materials include thermal gap fillers, thermal phase change materials, thermally-conductive EMI absorbers or hybrid thermal/EMI absorbers, thermal greases, thermal pastes, thermal putties, dispensable thermal interface materials, thermal pads, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A frame for an electromagnetic interference (EMI) shielding assembly, the frame comprising:
    one or more sidewalls configured for installation to a substrate generally about one or more components along the substrate; and
    one or more fingers or tabs extending upwardly above the one or more sidewalls and alignable with and positionable along an interior length of a corresponding one or more gaps defined generally between portions of one or more sidewalls of a cover attachable to the frame for covering the corresponding one or more gaps when the cover is attached to the frame;
    wherein:
        the one or more fingers or tabs are configured to be positioned underneath an interior defined by the cover alongside inner surfaces of the portions of the one or more sidewalls of the cover defining the corresponding one or more gaps such that the one or more fingers or tabs thereby cover the corresponding one or more gaps when the cover is attached to the frame to thereby inhibit electromagnetic interference leakage through the one or more gaps that are covered by the one or more fingers or tabs;
        the frame includes an eave that extends inwardly from and along a perimeter defined by the one or more sidewalls of the frame;
        the one or more fingers or tabs extend upwardly above the eave of the frame; and
        the one or more fingers or tabs are integrally formed from corresponding portions of material cut from the eave and the corresponding one or more sidewalls of the frame and repositioned such that the one or more fingers or tabs extend upwardly above the eave of the frame.

2. The frame of claim 1, wherein the one or more fingers or tabs have a sufficient length to extend along an entire length of the corresponding one or more gaps when the cover is attached to the frame to thereby seal the corresponding one or more gaps against electromagnetic interference leakage through the corresponding one or more gaps.

3. An EMI shielding assembly comprising the frame of claim 1 and a cover attachable to the frame, whereby the EMI shielding assembly is operable for providing electromagnetic interference shielding for the one or more components along the substrate that are within an interior cooperatively defined by the frame and the cover when the cover is attached to the frame and the frame is installed to the substrate about the one or more components.

4. The EMI shielding assembly of claim 3, wherein:
    the cover includes one or more sidewalls and one or more gaps defined generally between portions of the one or more sidewalls of the cover; and
    the one or more fingers or tabs of the frame are alignable with and configured to be positioned underneath the cover alongside inner surfaces of the portions of the one or more sidewalls of the cover defining the one or more gaps such that the one or more fingers or tabs thereby cover the corresponding one or more gaps when the cover is attached to the frame to thereby inhibit electromagnetic interference leakage through the one or more gaps that are covered by the one or more fingers or tabs.

5. The EMI shielding assembly of claim 3, wherein:
    the frame includes one or more pickup members extending inwardly from the eave and configured to allow the frame to be picked up via pick and place equipment;
    the EMI shielding assembly comprises an EMI absorber; and
    the one or more pickup members define a support surface on which the EMI absorber is positioned such that the EMI absorber is generally between an underside of the cover and the one or more pickup members when the cover is attached to the frame.

6. The EMI shielding assembly of claim 3, wherein:
    the cover comprises one or more sidewalls including one or more inwardly extending dimples or protrusions;
    the one or more sidewalls of the frame include one or more holes configured for engagingly receiving corresponding ones of the one or more inwardly extending dimples or protrusions of the cover;
    whereby the cover is releasably attachable to, detachable from, and reattachable to the frame.

7. A method of using the frame of claim 1 and a cover attachable to the frame for providing electromagnetic interference shielding for one or more components along a substrate, the method comprising using at least one finger or tab of the one or more fingers or tabs of the frame that extends upwardly above the one or more sidewalls of the frame along an interior side and/or length of at least one gap defined generally between portions of one or more sidewalls of the cover for covering the at least one gap to thereby inhibit electromagnetic interference leakage through the at least one gap that is covered by the at least one finger or tab.

8. The method of claim 7, wherein the method comprises attaching the cover to the frame, which includes:
   aligning the at least one finger or tab of the frame with the at least one gap and positioning the at least one finger or tab underneath an interior defined by the cover alongside inner surfaces of the portions of the one or more sidewalls of the cover defining the at least one gap; and
   covering the at least one gap with the at least one finger or tab of the frame to thereby inhibit electromagnetic interference leakage through the at least one gap that is covered by the at least one finger or tab.

9. The method of claim 8, wherein the method includes installing the frame to the substrate about the one or more components along the substrate, whereby the frame and the cover are operable for providing electromagnetic interference shielding for the one or more components along the substrate that are within an interior cooperatively defined by the frame and the cover.

10. A frame for an electromagnetic interference (EMI) shielding assembly, the frame comprising:
   one or more sidewalls configured for installation to a substrate generally about one or more components along the substrate; and
   one or more fingers or tabs extending upwardly above the one or more sidewalls and alienable with and positionable along an interior length of a corresponding one or more gaps defined generally between portions of one or more sidewalls of a cover attachable to the frame for covering the corresponding one or more gaps when the cover is attached to the frame;
   wherein:
      the one or more fingers or tabs are configured to be positioned underneath an interior defined by the cover alongside inner surfaces of the portions of the one or more sidewalls of the cover defining the corresponding one or more gaps such that the one or more fingers or tabs thereby cover the corresponding one or more gaps when the cover is attached to the frame to thereby inhibit electromagnetic interference leakage through the one or more gaps that are covered by the one or more fingers or tabs;
      the frame includes an eave that extends inwardly from and along a perimeter defined by the one or more sidewalls of the frame;
      the one or more fingers or tabs extend upwardly above the eave of the frame;
      the one or more fingers or tabs are integrally formed from corresponding portions of material of the eave and the corresponding one or more sidewalls of the frame;
      the one or more sidewalls include an upper surface, a lower surface, and an upwardly extending sidewall portion between the upper and lower surfaces;
      the lower surface of the one or more sidewalls of the frame is configured for installation to the substrate generally about the one or more components along the substrate; and
      the eave extends inwardly from and along the perimeter defined by the upper surface of the one or more sidewalls of the frame, whereby the eave defines an open top of the frame having a perimeter with a closed shape, and the open top of the frame is covered by the cover when the cover is attached to the frame.

11. The frame of claim 10, wherein the one or more fingers or tabs are integrally formed from corresponding portions of material cut from the eave and the corresponding one or more sidewalls of the frame and repositioned such that the one or more fingers or tabs extend upwardly above the eave of the frame.

12. An EMI shielding assembly comprising a frame and a cover attachable to the frame;
   wherein:
      the cover includes one or more sidewalls and one or more gaps defined generally between portions of the one or more sidewalls of the cover;
      the frame includes one or more sidewalls configured for installation to a substrate generally about one or more components along the substrate; and one or more fingers or tabs extending upwardly above the one or more sidewalls of the frame and alignable with and positionable along an interior length of a corresponding one of the one or more gaps defined generally between the portions of the one or more sidewalls of the cover for covering the corresponding one or more gaps when the cover is attached to the frame;
      the one or more fingers or tabs of the frame are alignable with and configured to be positioned underneath the cover alongside inner surfaces of the portions of the one or more sidewalls of the cover defining the one or more gaps such that the one or more fingers or tabs thereby cover the corresponding one or more gaps when the cover is attached to the frame to thereby inhibit electromagnetic interference leakage through the one or more gaps that are covered by the one or more fingers or tabs;
      the frame includes an eave that extends inwardly from and along a perimeter defined by the one or more sidewalls of the frame; and
      the one or more fingers or tabs extend upwardly above the inwardly extending eave of the frame and have a sufficient length such that one or more free end portions of the one or more fingers or tabs are configured to electrically contact an inner surface defined by a top of the cover when the cover is attached to the frame;
      whereby the EMI shielding assembly is operable for providing electromagnetic interference shielding for the one or more components along the substrate that are within an interior cooperatively defined by the frame and the cover when the cover is attached to the frame and the frame is installed to the substrate about the one or more components.

13. A method relating to a frame for an electromagnetic interference (EMI) shielding assembly, the method comprising providing the frame with at least one finger or tab that extends upwardly above one or more sidewalls of the frame and that is alignable with and configured to close off at least one gap defined generally between portions of one or more sidewalls of a cover attachable to the frame to thereby inhibit electromagnetic interference leakage through the at least one gap, wherein the method includes:
   cutting slots for the at least one finger or tab into a piece of material from which the frame will be made;
   forming the piece of material into a shape of the frame including an eave;
   forming an opening in the piece of material that extends between the slots such that a free end portion of the at least one finger or tab is cooperatively defined by the opening and the slots; and moving the at least one finger or tab relative to the slots and the eave such that the at least one finger or tab extends upwardly above a top surface of the eave.

14. The method of claim 13, further comprising configuring an end portion of the at least one finger or tab for making electrical contact with an inner surface defined by a top of the cover when the cover is attached to the frame.

15. The method of claim 13, wherein the method further comprises attaching the cover to the frame, which includes:
   aligning the at least one finger or tab of the frame with the at least one gap of the cover and positioning the at least one finger or tab underneath an interior defined by the cover alongside inner surfaces of the portions of the one or more sidewalls of the cover defining the at least one gap; and
   covering the at least one gap of the cover with the at least one finger or tab of the frame to thereby inhibit electromagnetic interference leakage through the at least one gap that is covered by the at least one finger or tab when the frame is installed to a substrate about one or more components along the substrate, whereby the frame and the cover are operable for providing electromagnetic interference shielding for the one or more components along the substrate that are within an interior cooperatively defined by the frame and the cover.

16. A method relating to a frame for an electromagnetic interference (EMI) shielding assembly, the method comprising providing the frame with at least one finger or tab that extends upwardly above one or more sidewalls of the frame and that is alignable with and configured to close off at least one gap defined generally between portions of one or more sidewalls of a cover attachable to the frame to thereby inhibit electromagnetic interference leakage through the at least one gap, wherein the method includes:
   stamping slots for the at least one finger or tab into a piece of material from which the frame will be integrally made;
   drawing the stamped piece of material into a shape of the frame including a drawn eave;
   forming an opening in the stamped material that extends between the slots such that a free end portion of the at least one finger or tab is cooperatively defined by the opening and the slots;
   moving the at least one finger or tab relative to the slots and the drawn eave such that the at least one finger or tab extends upwardly above a top surface of the drawn eave.

17. The method of claim 16, wherein moving the at least one finger or tab relative to the slots and the drawn eave comprises wiping, folding, or bending the at least one finger or tab relative to the drawn eave such that:
   the at least one finger or tab is vertically upright and/or generally parallel with one or more sidewalls of the frame; and/or
   the at least one finger or tab is generally perpendicular to the top surface of the drawn eave.

\* \* \* \* \*